(12) United States Patent
Tuck et al.

(10) Patent No.: US 10,459,017 B2
(45) Date of Patent: Oct. 29, 2019

(54) METHOD AND APPARATUS FOR DETECTING ELECTRICAL CONDUCTANCE INCLUDING CONTROL SYSTEM FOR ADJUSTING COMPRESSIVE FORCE APPLIED TO AN OBJECT BY AN ACTUATOR

(71) Applicant: THE BOEING COMPANY, Chicago, IL (US)

(72) Inventors: Derek Tuck, Isle of Palms, SC (US); Thaddeus Wells, Ladson, SC (US)

(73) Assignee: The Boeing Company, Chicago, IL (US)

( * ) Notice: Subject to any disclaimer, the term of this patent is extended or adjusted under 35 U.S.C. 154(b) by 340 days.

(21) Appl. No.: 15/227,549

(22) Filed: Aug. 3, 2016

(65) Prior Publication Data
US 2018/0038902 A1 Feb. 8, 2018

(51) Int. Cl.
*B23K 13/04* (2006.01)
*G01R 27/02* (2006.01)

(52) U.S. Cl.
CPC .................................... *G01R 27/02* (2013.01)

(58) Field of Classification Search
CPC .... G01R 27/02; G01R 27/2605; G01R 27/26; G01N 27/24; G01N 27/02; G01N 27/22; G01N 33/44; G01L 1/14; G01L 1/16; B25J 9/1612; B25J 15/10; B25J 15/0028; Y10S 901/31; Y10S 901/47; Y10S 901/46; G06K 9/0002; G06F 3/0414; F16J 15/3296
See application file for complete search history.

(56) References Cited

U.S. PATENT DOCUMENTS

| | | | | |
|---|---|---|---|---|
| 4,408,115 A | * | 10/1983 | Tanenbaum | B23K 11/008 219/108 |
| 5,972,181 A | * | 10/1999 | Coin | B01D 53/1425 204/242 |
| 6,139,705 A | * | 10/2000 | Brown, Jr. | C25B 11/03 204/284 |
| 6,515,251 B1 | * | 2/2003 | Wind | B23K 11/255 219/110 |

(Continued)

FOREIGN PATENT DOCUMENTS

WO       WO 2011012853 A1 *  2/2011  ........... B23K 13/046

*Primary Examiner* — Brandi N Hopkins
(74) *Attorney, Agent, or Firm* — McDonnell Boehnen Hulbert & Berghoff LLP (57) ABSTRACT

An example method includes causing an actuator to apply a compressive force to an object. The compressive force pushes a first electrode against a first end of the object and causes a second end of the object to push against a second electrode. The method further includes detecting an initial magnitude of the compressive force. The method further includes, in response to determining that the initial magnitude of the compressive force is outside of a predetermined range of magnitude, causing the actuator to adjust the compressive force applied to the object. The method further includes detecting a magnitude of the adjusted compressive force. The method further includes, in response to determining that the magnitude of the adjusted compressive force is within the predetermined range of magnitude, detecting a conductance of the object via the first electrode and the second electrode.

20 Claims, 6 Drawing Sheets

(56) References Cited

U.S. PATENT DOCUMENTS

2004/0265677 A1* 12/2004 Losfeld .................. B22F 7/004
  429/444
2015/0294877 A1* 10/2015 Kitano .............. H01L 21/02532
  438/475

* cited by examiner

METHOD AND APPARATUS FOR DETECTING ELECTRICAL CONDUCTANCE INCLUDING CONTROL SYSTEM FOR ADJUSTING COMPRESSIVE FORCE APPLIED TO AN OBJECT BY AN ACTUATOR

FIELD

The present disclosure generally relates to methods and systems for detecting an electrical conductance of an object, and more particularly to methods and systems for monitoring and controlling a force applied to the object via electrodes while detecting the conductance of the object.

BACKGROUND

Being able to detect an electrical conductance of a material with a high degree of accuracy may be useful in various situations. For example, carbon fiber reinforced plastic (CFRP) may be used to form an exterior skin of an airplane. Commercial airplanes in the United States are reportedly struck by lightning in flight more than once per year on average. As such, being able to accurately predict how a lightning strike would affect a particular formulation of CFRP or other materials may be useful. For instance, if the CFRP of an airplane's skin is too resistive to electric current flow, a lightning strike might generate an undesirable amount of heat. The known conductance of CFRP may be used to increase the accuracy of a simulation of a lightning strike event, for example.

The accuracy and/or precision (e.g., repeatability) of measurements performed by a conductance measuring device may be dependent on how much force is applied to the material under test by electrodes of the device. Conductance measurements of the same portion of material might differ significantly if the contact force is not consistently applied.

Accordingly, there is a need for an apparatus and a method for monitoring and controlling a compressive force applied by electrodes to facilitate reliable conductance measurements.

SUMMARY

In one example, a method for detecting an electrical conductance of an object is described. The method includes causing, via a control system, an actuator to apply a compressive force to the object. The compressive force pushes a first electrode against a first end of the object and causes a second end of the object to push against a second electrode. The method further includes detecting, via a load cell, an initial magnitude of the compressive force. The method further includes, in response to determining that the initial magnitude of the compressive force is outside of a predetermined range of magnitude, causing, via the control system, the actuator to adjust the compressive force applied to the object. The method further includes detecting, via the load cell, a magnitude of the adjusted compressive force. The method further includes, in response to determining that the magnitude of the adjusted compressive force is within the predetermined range of magnitude, detecting a conductance of the object via the first electrode and the second electrode.

In another example, an apparatus for detecting an electrical conductance of an object is described. The apparatus includes an actuator, a first electrode, and a second electrode that faces the first electrode. The actuator is configured to move the first electrode along a longitudinal axis of the apparatus. The apparatus further includes a load cell configured to detect a force applied to the second electrode along the longitudinal axis. The apparatus further includes a control system configured to perform functions. The functions include causing the actuator to apply a compressive force to the object. The compressive force pushes the first electrode against a first end of the object and causes a second end of the object to push against the second electrode. The functions further include detecting, via the load cell, an initial magnitude of the compressive force. The functions further include, in response to determining that the initial magnitude of the compressive force is outside of a predetermined range of magnitude, causing the actuator to adjust the compressive force applied to the object. The functions further include detecting, via the load cell, a magnitude of the adjusted compressive force. The functions further include, in response to determining that the magnitude of the adjusted compressive force is within the predetermined range of magnitude, detecting a conductance of the object via the first electrode and the second electrode.

In yet another example, a method for detecting an electrical conductance of an object is described. The method includes causing, via a control system, an actuator to apply a compressive force to the object. The compressive force pushes a first electrode against a first end of the object and causes a second end of the object to push against a second electrode. The method further includes detecting, via a load cell, a magnitude of the compressive force. The method further includes, in response to determining that the magnitude of the compressive force is within a predetermined range of magnitude, detecting a conductance of the object via the first electrode and the second electrode.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying Figures.

DETAILED DESCRIPTION

As noted above, it may be useful to monitor and control a compressive force applied by electrodes to an object under test, to facilitate accurate and/or precise conductance measurements. For example, an apparatus may be configured to apply the compressive force to the object via electrodes that are positioned on opposite sides of the object. A control system may detect (e.g., in real-time) the magnitude of the compressive force and adjust the magnitude of the compressive force to be within a predetermined range of magnitude. Once the control system determines that the magnitude of the compressive force is within the predetermined range of magnitude and/or has settled within the predetermined range of magnitude, the control system may detect, via the electrodes, the conductance of the object. Using a control system to implement closed-loop force detection feedback may facilitate more accurate and/or precise conductance measurements than open loop processes.

Disclosed embodiments will now be described more fully hereinafter with reference to the accompanying Drawings, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

By the term "about" or "substantially" with reference to amounts or measurement values, it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Figure 1:
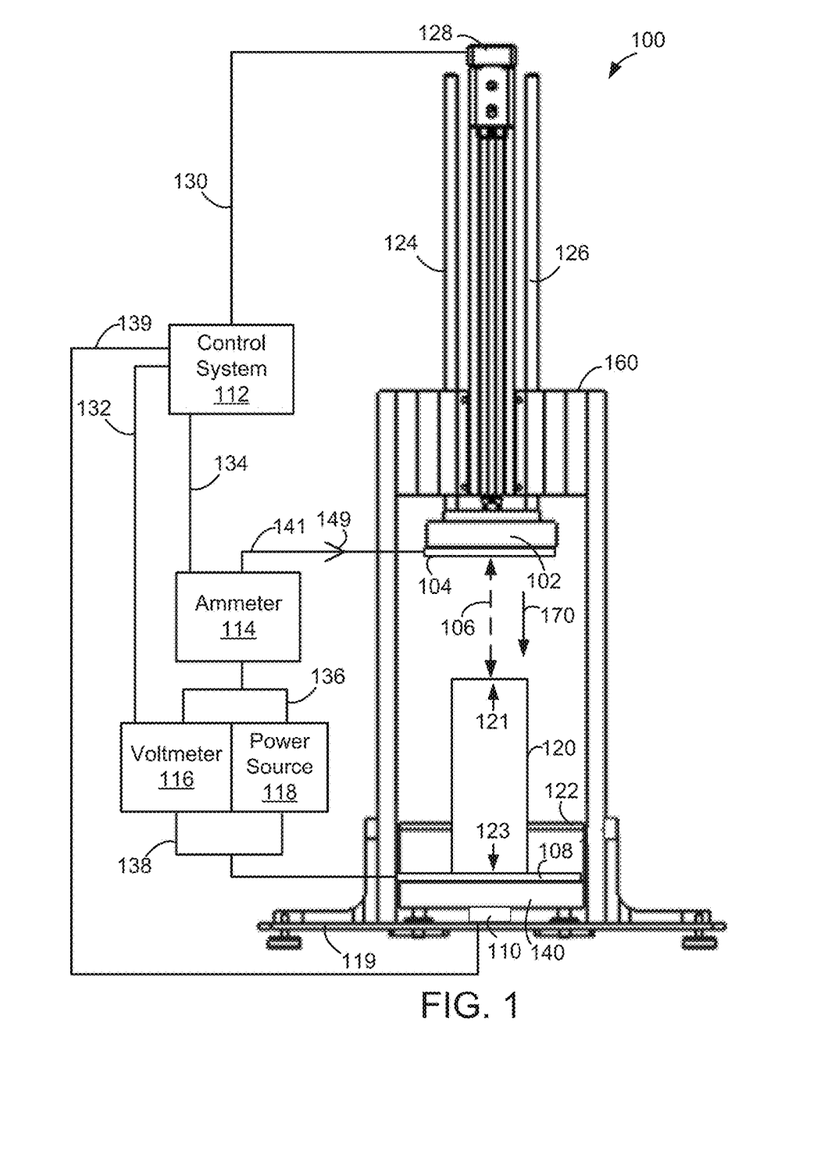
FIG. 1 illustrates an example apparatus for detecting an electrical conductance of an object, according to an example embodiment.

FIG. 1 illustrates an apparatus 100 for detecting an electrical conductance of an object 120, according to an example embodiment. The apparatus 100 includes an actuator 102 that is configured to move along a longitudinal axis 106. The apparatus 100 further includes electrodes 104 and 108, a load cell 110, a control system 112, an ammeter 114, a voltmeter 116, a power source 118, a platform 119, a backboard 122, rods 124 and 126, a motor 128, communication links 130, 132, 134, and 139, wired connections 136, 138, and 141, a base 140, and a frame 160.

The actuator 102 may take the form of a piston that is configured to move (e.g., up or down) along the longitudinal axis 106. Also, the actuator 102 may be attached to the rods 124 and 126. The rods 124 and 126 may be configured to move parallel to the longitudinal axis 106 through respective holes (not shown) in the frame 160, thereby facilitating movement of the actuator 102 along the longitudinal axis 106. The rods 124 and 126 may resist motion of the actuator 102 in directions that are perpendicular to the longitudinal axis 106. This may help align the actuator 102 to apply a compressive force 170, via the electrode 104, to the object 120 along the longitudinal axis 106.

The electrode 104 may be affixed to the actuator 102 to face the electrode 108. The electrode 104 may include conductive material configured to make an ohmic contact with the object 120 for detecting a conductance of the object 120. The structure of the electrode 104 is described in more detail below with reference to FIG. 4.

The electrode 108 may be mounted on the base 140 to face the electrode 104. When the apparatus 100 is in use, the object 120 may rest on the electrode 108, thereby forming an ohmic contact for detecting a conductance of the object 120. The base 140 may take the form of an insulating plastic block, but other examples are possible. The structure of the electrode 108 is described in more detail below with reference to FIG. 4.

The load cell 110 may be configured to detect the compressive force 170 applied to the electrode 108 along the longitudinal axis 106. In some examples, the actuator 102 may move downward to apply the compressive force 170 to an end 121 of the object 120, such that an end 123 of the object 120 may apply a force to the electrode 108 that is transferred through the base 140 to be detected by the load cell 110. More specifically, the load cell 110 may be inserted between the base 140 and the platform 119 such that the load cell 110 senses a force that is substantially equal to the compressive force 170 applied by the actuator 102. The platform 119 may take the form of a metal plate, but other examples are possible.

The load cell 110 may take the form of a piezoelectric load cell or a capacitive load cell, among other examples. In one example, the load cell 110 might include a piezoelectric material that exhibits a voltage that is indicative of an amount of force applied to the piezoelectric material along the longitudinal axis 106. In another example, the load cell 110 may exhibit a capacitance that is indicative of an amount of separation between conductive plates of the load cell 110, which may be further dependent on an amount of force applied to the load cell 110 along the longitudinal axis 106.

The control system 112 may take the form of a programmable logic controller (PLC), a computing device, or any other combination of hardware and/or software configurable to perform the methods described herein. The control system 112 may be communicatively coupled to the motor 128 via the communication link 130. More specifically, the control system 112 may be configured to control the motor 128 by sending control signals via the communication link 130 and/or configured to receive feedback signals from the motor 128 via the communication link 130. Also, the control system 112 may be configured to receive, from the load cell 110 via the communication link 139, a signal indicative of the magnitude of the compressive force 170 detected by the load cell 110. Additionally, the control system 112 may be configured to receive, from the voltmeter 116 via the communication link 132, a signal indicative of the magnitude and/or polarity of a voltage detected by the voltmeter 116. Finally, the control system 112 may be configured to receive, from the ammeter 114 via the communication link 134, a signal indicative of the magnitude and/or direction of a current flowing through the ammeter 114 (e.g., the current 149).

The motor 128 may take the form of a servo motor, but may take other forms as well. The motor 128 may be configured to cause the actuator 102 to apply an adjustable compressive force 170 to the object 120, for example.

The ammeter 114 may include any device or circuit configurable to detect a magnitude and/or direction of an electric current 149 flowing through the ammeter 114. The ammeter 114 may also display an indication of the detected current magnitude or direction on a display screen. In some examples, the ammeter 114 may be integrated within the control system 112. When the actuator 102 is lowered to press the electrode 104 against the end 121 of the object 120, the ammeter 114 may be configured to detect a magnitude and/or a direction of the current 149 that flows from the power source 118, through the ammeter 114, the electrode 104, the object 120, and the electrode 108, and back to the power source 118.

The voltmeter 116 may include any device or circuit configurable to detect a polarity and/or a magnitude of a voltage between the electrodes 104 and 108. The voltmeter 116 may also display an indication of the detected polarity or magnitude of the voltage on a display screen. For ease of illustration, the voltmeter 116 is shown in FIG. 1 as being connected in parallel with the power source 118, but one of skill in the art will recognize that the voltage between the terminals of the ammeter 114 can be approximated to be zero. Thus, the voltage detected by the voltmeter 116 may be substantially equal to the voltage between the electrodes 104 and 108. In other examples, the voltmeter 116 may be connected directly to the electrode 104 to detect the voltage between the electrodes 104 and 108.

The power source 118 may be configured to operate as a constant voltage source or a constant current source. When the actuator 102 presses the electrode 104 against the object 120, a path for the current 149 is formed. The current path includes the power source 118, the ammeter 114, the electrode 104, the object 120, and the electrode 108. In a voltage source mode, the power source 118 may be configured provide a constant voltage between the electrodes 104 and 108, regardless of the conductance of the object 120. In a constant current mode, the power source 118 may be configured to provide a constant current 149 through the aforementioned current path, regardless of the conductance of the object 120.

The backboard 122 may be mounted to the frame 160 and may be useful to stabilize the object 120 as the actuator 102 applies the compressive force 170 to the object 120 along the longitudinal axis 106. In the perspective depicted in FIG. 1, the backboard 122 may be behind the object 120, but other examples are possible. The backboard 122 may take the form of an insulating (e.g., plastic) rod. The backboard 122 may resist motion of the object 120 that is perpendicular to the longitudinal axis 106. In other examples, the apparatus 100 may include one or more backboards that resist motion of the object 120 that is perpendicular to the longitudinal axis 106.

The communication links 130, 132, 134, and 139 may be wireless or wired connections configured for the transfer of data or signals. For example, the communication links 130, 132, 134, and 139 may take the form of Ethernet cable or metal wire. In other examples the communication links 130, 132, 134, and 139 may operate via a wireless communication protocol, such as WIFI, Bluetooth, or the like.

The wired connections 136, 138, and 141, may include wiring or other conductors configured to carry the level of currents that may be used to detect the conductance of the object 120.

The frame 160 may take the form of a machined metal structure, but could take the form of other materials such as plastic. Other examples are possible.

Figure 2:
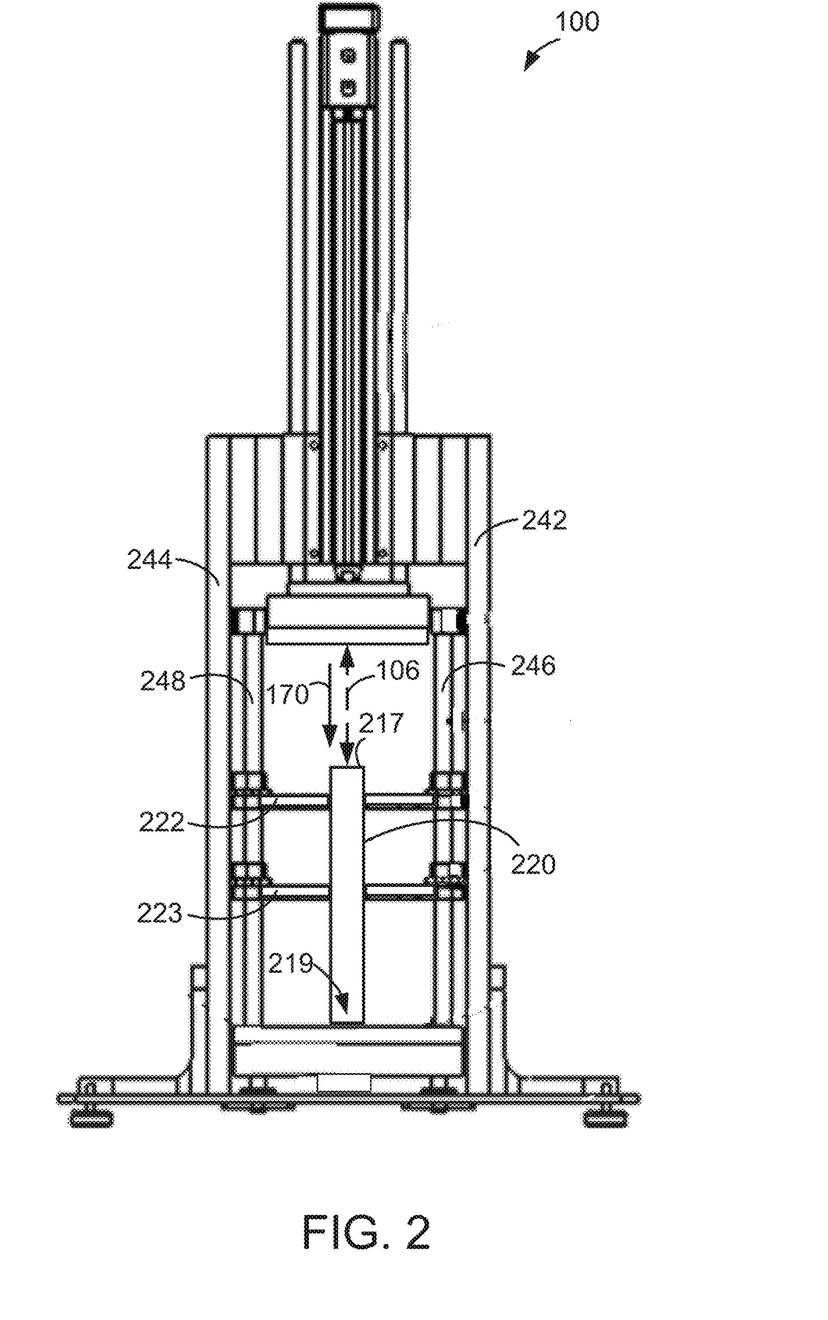
FIG. 2 illustrates an example apparatus for detecting an electrical conductance of an object, according to an example embodiment.

FIG. 2 further illustrates the apparatus 100, according to an example embodiment. Some features of the apparatus 100 that appear in FIG. 1 have been omitted in FIG. 2 for the sake of simplicity. But, FIG. 2 also illustrates that some of the features of the apparatus 100 are interchangeable and/or removable. For example, in FIG. 2 the backboard 122 has been removed and replaced with backboards 222 and 223. FIG. 2 also illustrates that the apparatus 100 is configured to detect the conductance of objects of various shapes and sizes. For example, the object 220 is taller and narrower than the object 120.

Rods 246 and 248 may be mounted respectively on frame rails 242 and 244. Each of the backboards 222 and 223 may include a receiving hole that corresponds to the rod 246 and a receiving hole that corresponds to the rod 248. The backboards 222 and 223 (and possibly additional backboards) may be moved up or down to a desired position and secured at the desired position via a set screw or other means. The backboards 222 and 223 may each have an inset region configured to partially surround the object 220. Using multiple backboards to surround the object 220 at two or more vertical positions may enable better stability of the object 220 during a conductance measurement than could be provided by the backboard 122 alone.

Figure 3:
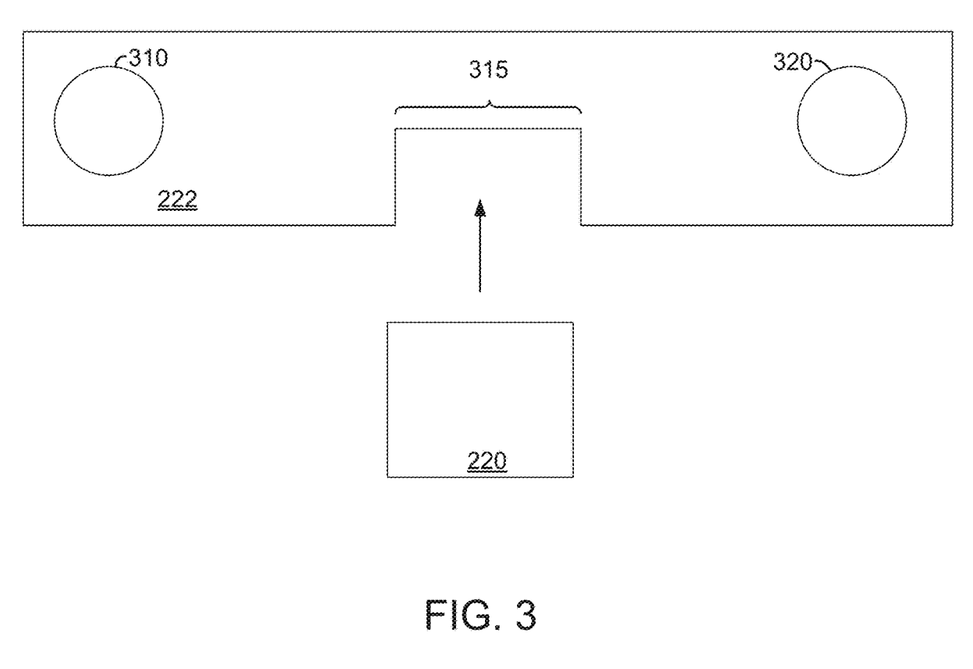
FIG. 3 illustrates an example backboard for supporting an object that is undergoing a conductance measurement, according to an example embodiment.

With reference to FIG. 2, FIG. 3 is a downward-looking view of the backboard 222, according to an example embodiment. The backboard 222 may include a receiving hole 310 configured to receive the rod 248, and a receiving hole 320 configured to receive the rod 246. As shown in FIG. 3, the backboard 222 may include an inset region 315 configured to surround the object 220. The backboard 223 may include features similar to those of the backboard 222.

Figure 4:
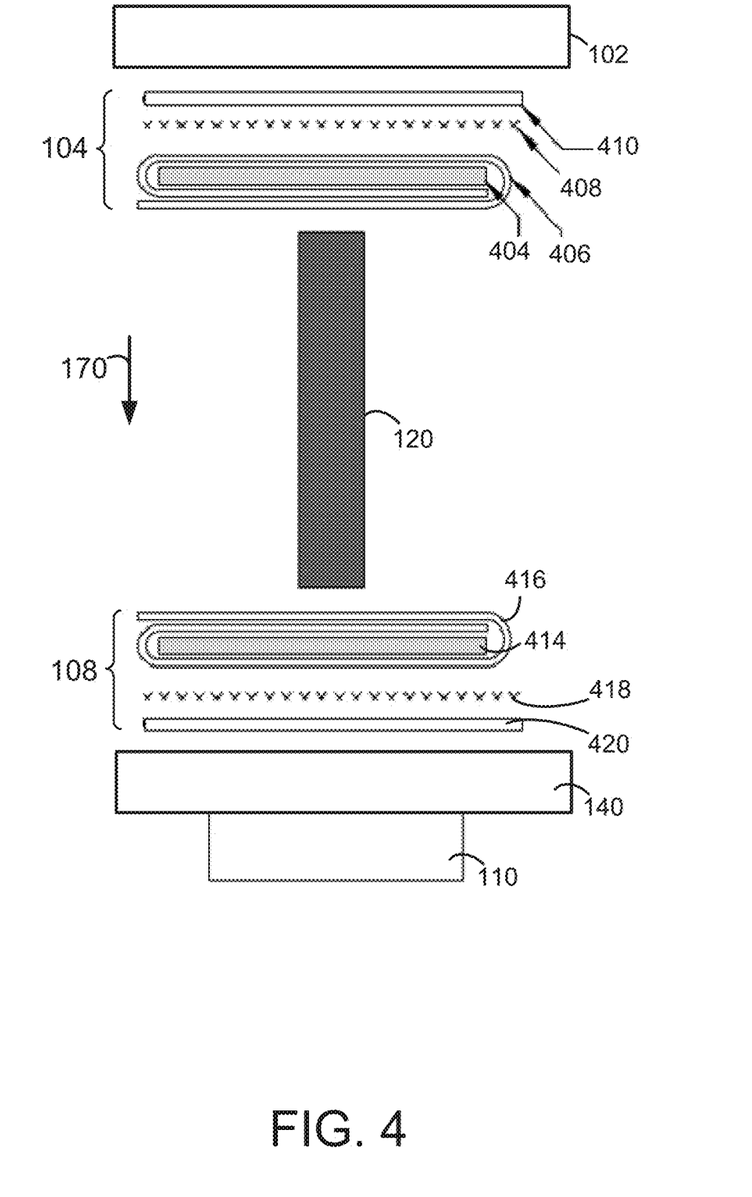
FIG. 4 is an exploded view of example electrodes, according to an example embodiment.

FIG. 4 is an exploded view of the electrodes 104 and 108, according to an example embodiment. The electrode 104 may include a core 404, a metal foil 406, a metal mesh 408, and a metal plate 410. The electrode 108 may include a core 414, a metal foil 416, a metal mesh 418, and a metal plate 420.

The core 404 may include a piece of silicone rubber, but other examples are possible. It may be advantageous for the core 404 to be a compressible material such as silicon rubber that can conform to the potentially irregular surface of the object 120 (or the object 220) in response to the compressive force 170 applied by the actuator 102. Allowing the electrode 104 to conform to the surface of the object 120 may enable more accurate and/or precise conductance measurements.

The metal foil 406 may be wrapped around the core 404 to form one or more layers of the metal foil 406 that surround the core 404. The metal foil 406 may include aluminum foil, but any metal may be used. The metal foil 406 may be brought into contact with the object 120 via the actuator 102.

The metal plate 410 may be glued or otherwise affixed to the actuator 102. The metal plate 410 may be made of copper, but other metals are possible. The surface of the actuator 102 to which the metal plate 410 is adhered may be an insulating surface, such that the current 149 does not flow through the actuator 102. The metal mesh 408 (e.g., copper) may be glued or otherwise affixed to the metal plate 410.

The core 404 wrapped in the metal foil 406 may be manually placed on top of the object 120 so that the actuator 102 may lower the metal mesh 408 to make contact with the metal foil 406. In other examples, the core 404 wrapped in the metal foil 406 may be glued or otherwise affixed to the metal mesh 408.

The core 414 may include a piece of silicone rubber, but other examples are possible. It may be advantageous for the core 414 to be a compressible material such as silicon rubber that can conform to the potentially irregular surface of the object 120 (or the object 220) in response to the compressive force 170 applied by the actuator 102. Allowing the electrode 108 to conform to the surface of the object 120 may enable accurate and/or precise conductance measurements.

The metal foil 416 may be wrapped around the core 414 to form one or more layers of the metal foil 416 that surround the core 414. The metal foil 416 may include aluminum foil, but any metal is possible. When the apparatus 100 is in use, the object 120 may rest upon the metal foil 416.

The metal plate 420 (e.g., copper) may be glued or otherwise affixed to the base 140. The surface of the base 140 to which the metal plate 420 is adhered may be an insulating surface, such that the current 149 does not flow through the base 140. The metal mesh 418 (e.g., copper) may be glued or otherwise affixed to the metal plate 420.

The core 414 wrapped in the metal foil 416 may be manually placed on top of the metal mesh 418 so that the actuator 102 may press the object 120 against the metal foil 416. In other examples, the core 414 wrapped in the metal foil 416 may be glued or otherwise affixed to the metal mesh 418.

Figure 5:
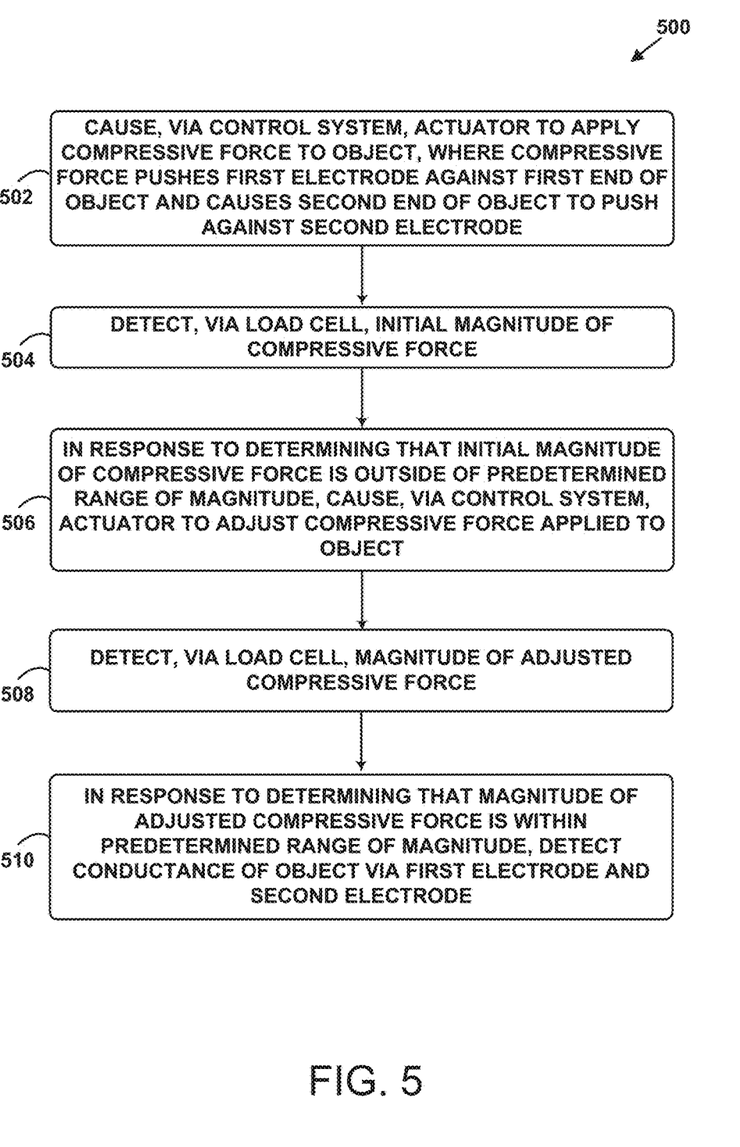
FIG. 5 is a flowchart of an example method for detecting an electrical conductance of an object, according to an example embodiment.
Figure 6:
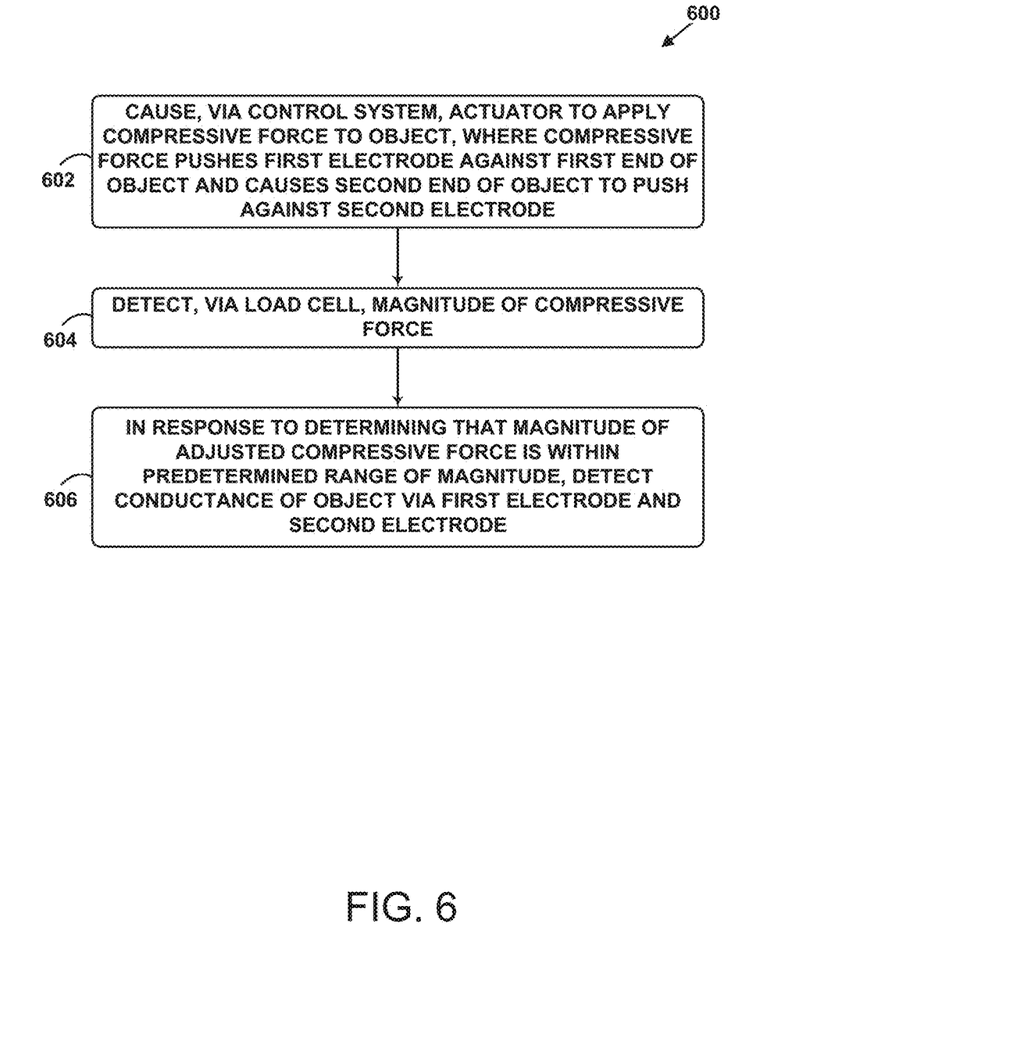
FIG. 6 is a flowchart of an example method for detecting an electrical conductance of an object, according to an example embodiment.

Methods 500 and 600 depicted in FIGS. 5 and 6 present example methods that can be performed by the apparatus 100. In other examples, the methods 500 and 600 may be performed by any combination of one or more suitable components described herein. FIGS. 5 and 6 may include one or more operations, functions, or actions as illustrated by one or more of blocks 502, 504, 506, 508, 510, 602, 604, and 606. Although the blocks are illustrated in a sequential order, these blocks may in some instances be performed in parallel, and/or in a different order than those described herein. Also, the various blocks may be combined into fewer blocks, divided into additional blocks, and/or removed based upon the desired implementation.

In addition, for the methods 500 and 600, and other processes and methods disclosed herein, the flowcharts show functionality and operation of one possible implementation of present embodiments. In this regard, each block may represent a module, a segment, or a portion of program code, which includes one or more instructions executable by a processor for implementing specific logical functions or steps in a process. The program code may be stored on any type of computer readable medium, for example, such as a storage device including a disk or hard drive. The computer readable medium may include a non-transitory computer readable medium, for example, such as computer readable media that stores data for short periods of time like register memory, processor cache, or Random Access Memory (RAM). The computer readable medium may also include non-transitory media, such as secondary or persistent long term storage, like read-only memory (ROM), optical or magnetic disks, or compact-disc read-only memory (CD-ROM), for example. The computer readable media may also be any other volatile or non-volatile storage system. The computer readable medium may be considered a computer readable storage medium, a tangible storage device, or other article of manufacture, for example.

In addition, for the methods 500 and 600 and other processes and methods disclosed herein, each block in FIGS. 5 and 6 may represent circuitry that is wired to perform the specific logical functions in the process.

Referring to FIG. 5, the method 500 is an example method for detecting an electrical conductance of an object.

At block 502, the method 500 includes causing, via a control system, an actuator to apply a compressive force to the object. For example, the control system 112 may cause the actuator 102 to apply the compressive force 170 to the object 120 (or the object 220). More specifically, the control system 112 may provide one or more control signals to the motor 128 via the communication path 130. The control signals may cause the motor 128 to apply the compressive force 170 to the object 120. The compressive force 170 may push the electrode 104 against the end 121 of the object 120 and cause the end 123 of the object 120 to push against the electrode 108.

At block 504, the method 500 includes detecting, via a load cell, an initial magnitude of the compressive force. For example, the load cell 110 may detect an initial magnitude of the compressive force 170 applied by the actuator 102 and generate an initial load signal indicative of the initial magnitude of the compressive force 170. The control system 112 may receive the initial load signal from the load cell 110 via the communication path 139.

At block 506, the method 500 includes, in response to determining that the initial magnitude of the compressive force is outside of a predetermined range of magnitude, causing, via the control system, the actuator to adjust the compressive force applied to the object. In one example, the control system 112 may determine that the initial load signal corresponds to an initial magnitude of the compressive force 170 that is less than a lower threshold of the predetermined range of force magnitudes. Accordingly, the control system 112 may cause the actuator 102 to increase the compressive force 170 applied to the object 120.

In a specific example, the control system 112 may determine that the initial load signal received from the load cell 110 corresponds to an initial magnitude of 200 newtons. The control system 112 may then determine that the initial magnitude of 200 newtons is less than a lower threshold of 300 newtons of a predetermined range of 300-400 newtons. Accordingly, the control system 112 may cause the actuator 102 to increase the compressive force 170 applied to the object 120, with an arm of adjusting the magnitude of the compressive force 170 to be within the predetermined range of 300-400 newtons.

Alternatively, the control system 112 may determine that the initial load signal corresponds to an initial magnitude of the compressive force 170 that is greater than an upper threshold of the predetermined range of force magnitudes. In a specific example, the control system 112 may determine that the initial load signal received from the load cell 110 corresponds to initial magnitude of 500 newtons. The control system 112 may then determine that the initial magnitude of 500 newtons is greater than an upper threshold of 400 newtons of a predetermined range of 300-400 newtons. Accordingly, the control system 112 may cause the actuator 102 to decrease the compressive force 170 applied to the object 120, with an arm of adjusting the magnitude of the compressive force 170 to be within the range of 300-400 newtons.

In some examples, the predetermined range of force magnitudes may be set via input received by a user interface of the control system 112.

At block 508, the method 500 includes detecting, via the load cell, a magnitude of the adjusted compressive force. For example, the load cell 110 may detect a magnitude of the adjusted compressive force 170 applied by the actuator 102 and generate an adjusted load signal indicative of the magnitude of the adjusted compressive force 170. The control system 112 may receive the adjusted load signal from the load cell 110 via the communication path 139.

At block 510, the method 500 includes, in response to determining that the magnitude of the adjusted compressive force is within the predetermined range of magnitude, detecting a conductance of the object via the first electrode and the second electrode. In one example, the control system 112 may determine that the adjusted load signal corresponds to a magnitude of the adjusted compressive force 170 that is within the predetermined range of force magnitudes. Accordingly, the control system 112 may cause the ammeter 114 to detect a magnitude and/or direction of the current 149 while the magnitude of the adjusted compressive force 170 is within the predetermined range of magnitudes. Similarly, the control system 112 may cause the voltmeter 116 to detect a magnitude and/or polarity of the voltage between the electrode 104 and the electrode 108 while the magnitude of the adjusted compressive force 170 is within the predetermined range of magnitudes.

Concurrent with any of blocks 502-510, the power source 118 may cause the current 149 to flow through the object 120. The current 149 may flow from the electrode 104 through the object 120 to the electrode 108.

In some examples, the ammeter 114 and the voltmeter 116 may continue to respectively monitor the current 149 and the voltage between the electrode 104 and the electrode 108, and send signals indicative of these measurements to the control system 112. In this case, the control system 112 may, while the magnitude of the adjusted compressive force 170 is within the predetermined range of magnitudes, store the current reading from the ammeter 114 and the voltage reading of the voltmeter 116. The control system 112 may then determine the conductance of the object 120 by dividing the magnitude of the voltage detected by the voltmeter 116 by the magnitude of the current 149 detected by the ammeter 114.

Before detecting the conductance of the object 120 via the electrodes 104 and 108, the control system 112 may determine that the magnitude of the adjusted compressive force 170 has remained within the predetermined range of magnitude for a continuous duration that exceeds a predetermined threshold duration (e.g., 3 seconds). This may be done in an effort to increase the likelihood that the magnitude of the adjusted compressive force 170 has "settled" within the predetermined range of magnitudes.

Referring to FIG. 6, the method 600 is an example method for detecting an electrical conductance of an object.

At block 602, the method 600 includes causing, via a control system, an actuator to apply a compressive force to the object. In this context, the compressive force pushes a first electrode against a first end of the object and causes a second end of the object to push against a second electrode. Block 602 may be performed similarly to block 502, as described above.

At block 604, the method 600 includes detecting, via a load cell, a magnitude of the compressive force. Block 604 may be performed similarly to block 504, as described above.

At block 606, the method 600 includes, in response to determining that the magnitude of the compressive force is within a predetermined range of magnitude, detecting a conductance of the object via the first electrode and the second electrode. Block 606 may be performed similarly to block 510, as described above.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to explain the principles of the embodiments, the practical application, and to enable others of ordinary skill in the art to understand the disclosure for various embodiments with various modifications as are suited to the particular use contemplated.

What is claimed is:

1. A method for detecting an electrical conductance of an object, the method comprising:
    causing, via a control system, an actuator to apply a compressive force to the object, wherein the compressive force pushes a first electrode against a first end of the object and causes a second end of the object to push against a second electrode;
    detecting, via a load cell, an initial magnitude of the compressive force;
    in response to determining that the initial magnitude of the compressive force is outside of a predetermined range of magnitude, causing, via the control system, the actuator to adjust the compressive force applied to the object;
    detecting, via the load cell, a magnitude of the adjusted compressive force; and
    in response to determining that the magnitude of the adjusted compressive force is within the predetermined range of magnitude, detecting a conductance of the object via the first electrode and the second electrode.

2. The method of claim 1, wherein causing the actuator to apply the compressive force comprises the control system providing a control signal to a motor of the actuator.

3. The method of claim 1, wherein detecting the initial magnitude of the compressive force comprises the control system receiving, from the load cell, a signal that indicates the initial magnitude of the compressive force.

4. The method of claim 1,
    wherein determining that the initial magnitude of the compressive force is outside of the predetermined range of magnitude comprises determining that the initial magnitude of the compressive force is less than a lower threshold of the predetermined range of magnitude, and
    wherein causing the actuator to adjust the compressive force comprises causing the actuator to increase the compressive force applied to the object.

5. The method of claim 1,
    wherein determining that the initial magnitude of the compressive force is outside of the predetermined range of magnitude comprises determining that the initial magnitude of the compressive force is greater than an upper threshold of the predetermined range of magnitude, and
    wherein causing the actuator to adjust the compressive force comprises causing the actuator to decrease the compressive force applied to the object.

6. The method of claim 1, wherein determining that the magnitude of the adjusted compressive force is within the predetermined range of magnitude comprises determining that the magnitude of the adjusted compressive force is within the predetermined range of magnitude for a continuous duration that exceeds a predetermined threshold duration.

7. The method of claim 1, wherein detecting the conductance of the object comprises:
    via a power source, causing current to flow through the object and between the first electrode and the second electrode;
    detecting a voltage between the first electrode and the second electrode while the current is flowing;
    detecting a magnitude of the current; and determining the conductance of the object based on the detected voltage and the detected magnitude of the current.

8. An apparatus for detecting an electrical conductance of an object, the apparatus comprising:
 an actuator;
 a first electrode affixed to the actuator, wherein the actuator is configured to move the first electrode along a longitudinal axis of the apparatus;
 a second electrode that faces the first electrode;
 a load cell configured to detect a force applied to the second electrode along the longitudinal axis; and
 a control system configured to perform functions comprising:
  causing the actuator to apply a compressive force to the object, wherein the compressive force pushes the first electrode against a first end of the object and causes a second end of the object to push against the second electrode;
  detecting, via the load cell, an initial magnitude of the compressive force;
  in response to determining that the initial magnitude of the compressive force is outside of a predetermined range of magnitude, causing the actuator to adjust the compressive force applied to the object;
  detecting, via the load cell, a magnitude of the adjusted compressive force; and
  in response to determining that the magnitude of the adjusted compressive force is within the predetermined range of magnitude, detecting a conductance of the object via the first electrode and the second electrode.

9. The apparatus of claim 8, further comprising one or more rods configured to guide motion of the actuator along the longitudinal axis and configured to resist motion of the actuator that is perpendicular to the longitudinal axis.

10. The apparatus of claim 8, further comprising one or more backboards configured to resist motion of the object that is perpendicular to the longitudinal axis.

11. The apparatus of claim 8, wherein the first electrode comprises:
 a core;
 a metal foil wrapped around the core;
 a metal plate affixed to the actuator; and
 a metal mesh affixed to the metal plate, wherein the metal mesh contacts the metal foil.

12. The apparatus of claim 11, wherein the core comprises silicone rubber.

13. The apparatus of claim 11, wherein the metal foil comprises aluminum foil and the metal mesh comprises a copper mesh.

14. The apparatus of claim 8, further comprising a base, wherein the second electrode comprises:
 a core;
 a metal foil wrapped around the core;
 a metal plate affixed to the base; and
 a metal mesh affixed to the metal plate, wherein the metal mesh contacts the metal foil.

15. The apparatus of claim 14, wherein the core comprises silicone rubber.

16. The apparatus of claim 8, wherein the load cell comprises a piezoelectric load cell.

17. The apparatus of claim 8, wherein the load cell comprises a capacitive load cell.

18. A method for detecting an electrical conductance of an object, the method comprising:
 causing, via a control system, an actuator to apply a compressive force to the object, wherein the compressive force pushes a first electrode against a first end of the object and causes a second end of the object to push against a second electrode;
 detecting, via a load cell, a magnitude of the compressive force; and
 in response to determining that the magnitude of the compressive force is within a predetermined range of magnitude, detecting a conductance of the object via the first electrode and the second electrode.

19. The method of claim 18, wherein determining that the magnitude of the compressive force is within the predetermined range of magnitude comprises determining that the magnitude of the compressive force is within the predetermined range of magnitude for a continuous duration that exceeds a predetermined threshold duration.

20. The method of claim 18, wherein detecting the conductance of the object comprises:
 via a power source, causing current to flow through the object and between the first electrode and the second electrode;
 detecting a voltage between the first electrode and the second electrode while the current is flowing;
 detecting a magnitude of the current; and
 determining the conductance of the object based on the detected voltage and the detected magnitude of the current.

* * * * *